United States Patent
Cooper et al.

(10) Patent No.: US 6,354,858 B1
(45) Date of Patent: Mar. 12, 2002

(54) RETENTION APPARATUS FOR FLASH MEMORY CARD

(75) Inventors: Larry Thomas Cooper, Boulder, CO (US); Brian Michael Kerrigan, Austin; John Richard Pugley, Round Rock, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/640,543

(22) Filed: Aug. 17, 2000

(51) Int. Cl.[7] ............................................. H01R 13/62
(52) U.S. Cl. ....................................... 439/327; 361/801
(58) Field of Search ......................... 439/327; 361/801; 411/41.17

(56) References Cited

U.S. PATENT DOCUMENTS

| | | | | |
|---|---|---|---|---|
| 4,862,327 A | * | 8/1989 | Ansell et al. | 361/802 |
| 5,175,669 A | * | 12/1992 | Navia et al. | 439/327 |
| 5,496,181 A | * | 3/1996 | Addison et al. | 361/801 |
| 5,642,263 A | * | 6/1997 | Lauruhn | 211/41.17 |
| 6,049,449 A | * | 4/2000 | Cranston, III et al. | 361/801 |
| 6,056,574 A | * | 5/2000 | Yoemans et al. | 361/801 |
| 6,220,887 B1 | * | 4/2001 | Downs | 361/801 |
| 6,229,709 B1 | * | 5/2001 | Hardt et al. | 361/801 |

* cited by examiner

Primary Examiner—Neil Abrams
(74) Attorney, Agent, or Firm—Joseph P. Lally; J. Bruce Schelkopf

(57) ABSTRACT

An apparatus suitable for retaining an electronic component such as a flash memory card within a socket attached to a system motherboard. The apparatus includes a housing that defines an aperture or slot suitably sized for receiving a distal end of the component and at least one arm extending from a first surface of the housing. A distal end of the arm receives a structural element of the system frame. Displacement of the apparatus housing relative to the structural element is restricted when the electronic component is received within the housing and the structural element is received within the receiving structure. The receiving structure may include an upper tab and a lower tab suitably displaced from one another to engage a sheet metal element of the data processing system frame. The arms may comprise a flexible material wherein application of a compressive force on the two arms disengages the tabs from the structural element.

15 Claims, 3 Drawing Sheets

RETENTION APPARATUS FOR FLASH MEMORY CARD

BACKGROUND

1. Field of the Invention

The present invention is related to the field of retention devices and more particularly to a device configured to retain a compact flash memory card of a data processing system in its socket.

2. History of Related Art

Data processing systems are typically designed with a relatively small amount of non-volatile, high speed memory for storing software (referred to as boot code) that is executed whenever the system is powered on or reset. The boot code may be responsible for restoring the system to a predetermined state such as by setting various registers. In addition, the boot code may load all or a portion of the operating system software into the system's system memory, which is typically comprised of an array of dynamic random access memory (DRAM) devices. The non-volatile storage element may also include the system's basic input output system (BIOS) that contains low level code for interfacing to the underlying hardware.

Historically, a system's boot code or BIOS was stored in a read only memory (ROM) device that was soldered or otherwise permanently affixed to the system's motherboard. If the ROM became non-functional or a revision to the boot code was desired, it was a time consuming and expensive process to replace the system's ROM. In addition, the conventional ROM device was relatively expensive and occupied an undesirably large area of the motherboard's space.

Advancements in non-volatile memory technology resulted in the fabrication and market acceptance of flash memory devices to provide non-volatile storage. Flash memories provide an electrically programmable non-volatile storage device that is erasable in large segments (blocks). The block erase feature of flash memories makes them well suited for containing control code such as a system's BIOS. When an update or revision to a system's BIOS is required, the block(s) of flash memory containing the BIOS is erased in a single cycle per block.

A common package for flash memory cells is the flash memory card. As its name implies, the flash memory card is an extremely thin and typically square or rectangular component that contains an array of flash memory cells. To assure that the flash memory card is securely mounted with the system, right angle connectors are typically employed to support the flash memory card in a plane parallel to the motherboard plane. Parallel mounting of the flash memory card, unfortunately, results in an undesirably large footprint and a cumbersome installation.

To minimize the footprint, the flash memory card could be inserted into an upright connector such that the plane of the flash memory card is perpendicular to the motherboard plane. Soldering or otherwise permanently affixing the flash memory card to its socket is undesirable because it is highly preferable to be able to easily replace the flash memory card in the event that the card becomes non-functional or to update the system's BIOS or boot code. Although an upright, non-soldered configuration beneficially minimizes the flash memory card's footprint and enables easy replacement of the flash memory card, it is not an ideal configuration from a mechanical perspective because the long and thin card can become easily dislodged within its socket during shipping or handling or during any maintenance operation that requires a technician or user to open the system's box. Without the appropriate electrical connection to the flash memory card, the system may become essentially non-functional.

Thus, maintaining the flash memory card in correct electrical connection within its socket is critical to system operation. It would, therefore, be highly desirable to implement an apparatus suitable for retaining a component such as a flash memory card within its socket. It would be further desirable if the implemented solution was compatible with a flash memory card that is easily removed from the device and did not require tools or special hardware to remove. It would be still further desirable if the implemented solution contained a minimum of moving parts and could be manufactured at a reasonable cost.

SUMMARY OF THE INVENTION

The goals identified above are achieved by an apparatus suitable for retaining an electronic component of a data processing system within a socket attached to a motherboard of the system. The apparatus includes a housing that defines an aperture suitably sized for receiving a distal end of the electronic component. The apparatus further includes at least one arm extending from a first surface of the housing. A distal end of each of the at least one arms includes a structure for receiving a structural element of the data processing system frame. Displacement of the apparatus housing relative to the structural element is restricted when a distal edge of the electronic component is received within the housing and the structural element is received within the receiving structure. The receiving structure may include an upper tab and a lower tab suitably displaced from one another to engage a sheet metal element of the data processing system frame. In one embodiment, the apparatus includes two affixed at opposite ends of the housing. The arms may be fabricated of a flexible material, such as molded plastic, wherein application of a compressive force on the two arms, such as by hand squeezing the two arms towards each other may disengage the tabs from the structural element. The apparatus may further include at least one leg affixed to the housing that extends from the housing in a direction opposite to the arm. A distal end of each of the legs may include a second structure configured to receive a second structural element of the data processing system frame. The second receiving structure may include a toothed element suitable for hooking the lower edge of the second structural element. The electronic component may comprise a flash memory card and the apparatus may retain the flash memory card in a plane substantially perpendicular to a plane of the motherboard.

BRIEF DESCRIPTION OF THE DRAWINGS

Other objects and advantages of the invention will become apparent upon reading the following detailed description and upon reference to the accompanying drawings in which.

Figure 1:
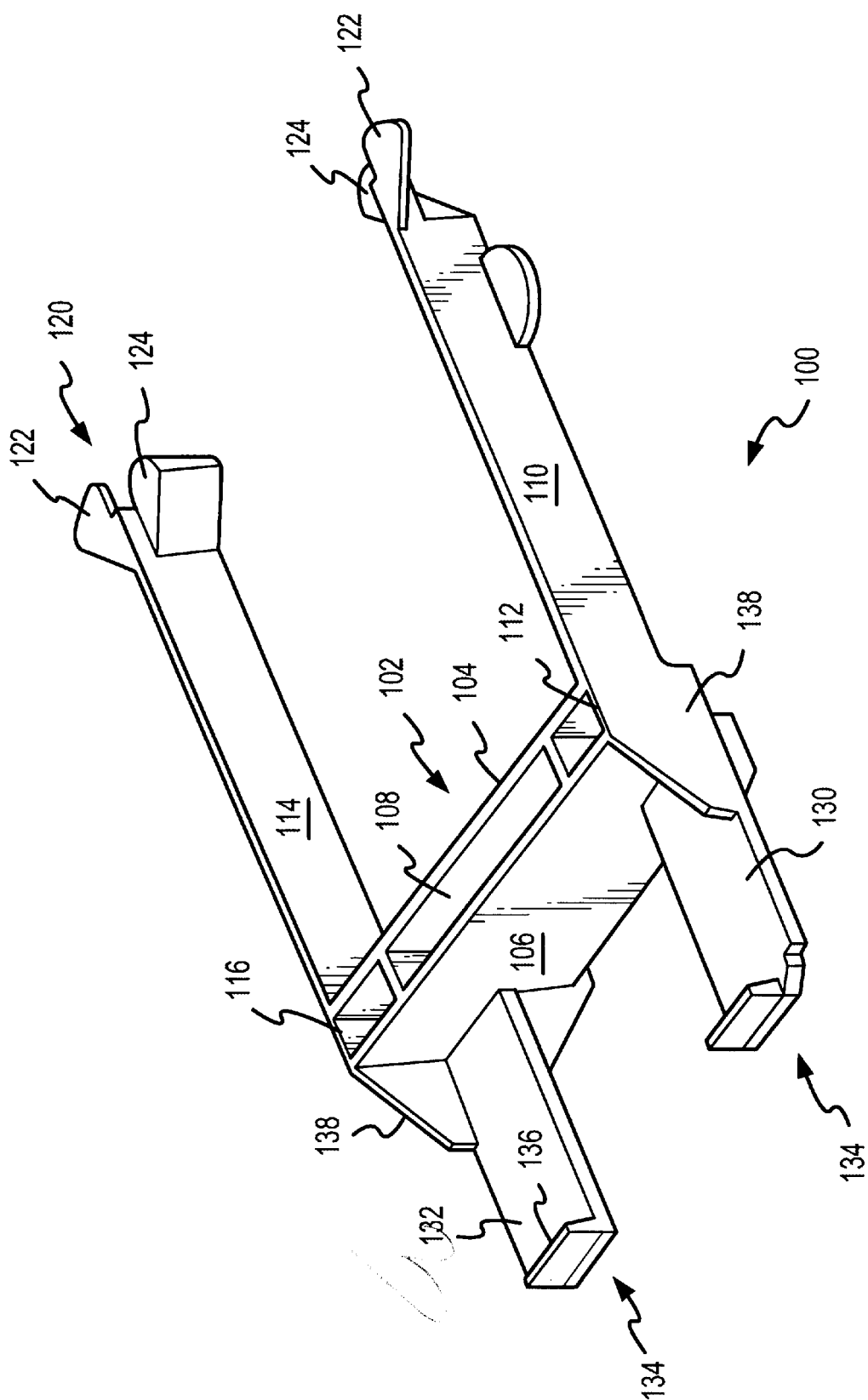
FIG. 1 illustrates a flash memory card retention apparatus according to one embodiment of the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 illustrates an apparatus 100 suitable for retaining a electronic component, such as a flash memory card, in a desirable position within a data processing system. In one embodiment, apparatus 100 is intended for use with a Type I flash memory card that is compliant with that PC Card Standard. The PC Card Standard (March 1997 Release) is published by the Personal Computer Memory Card International Association (PCMCIA) and is incorporated by reference herein. The flash memory card is installed perpendicular to the motherboard (or other circuit board) of a data processing system. In this perpendicular configuration, the flash memory card, which is typically not permanently affixed to the connector in which it is installed within the system, is subject to becoming dislodged during shipping or handling. Apparatus 100 provides an elegant solution to retaining the flash memory card in its desired position. In the preferred embodiment, apparatus 100 comprises a single piece of molded plastic that requires no tools to install.

With reference to FIG. 1, the depicted embodiment of apparatus 100 includes a housing 102 including a first face 104 and an opposed second face 106. Housing 102 defines an aperture or slot 108 (referred to herein after as aperture 108) that is suitably sized for receiving an electronic component. In one embodiment, aperture 108 is sized to receive an edge of a flash memory card. Aperture 108 may include an internal lip that engages the received flash card edge to prevent vertical movement (movement perpendicular to the motherboard) of the card.

Apparatus 100 includes at least one arm that extends substantially perpendicularly to the first face 104 of housing 102. In the depicted embodiment, apparatus 100 includes a first arm 110 connected to first end 112 of housing 102 and a second arm 114 connected to a second end 116 of housing 102. First and second arms 110 and 114 extend substantially perpendicularly from first face 104 of housing 102.

Figure 3:
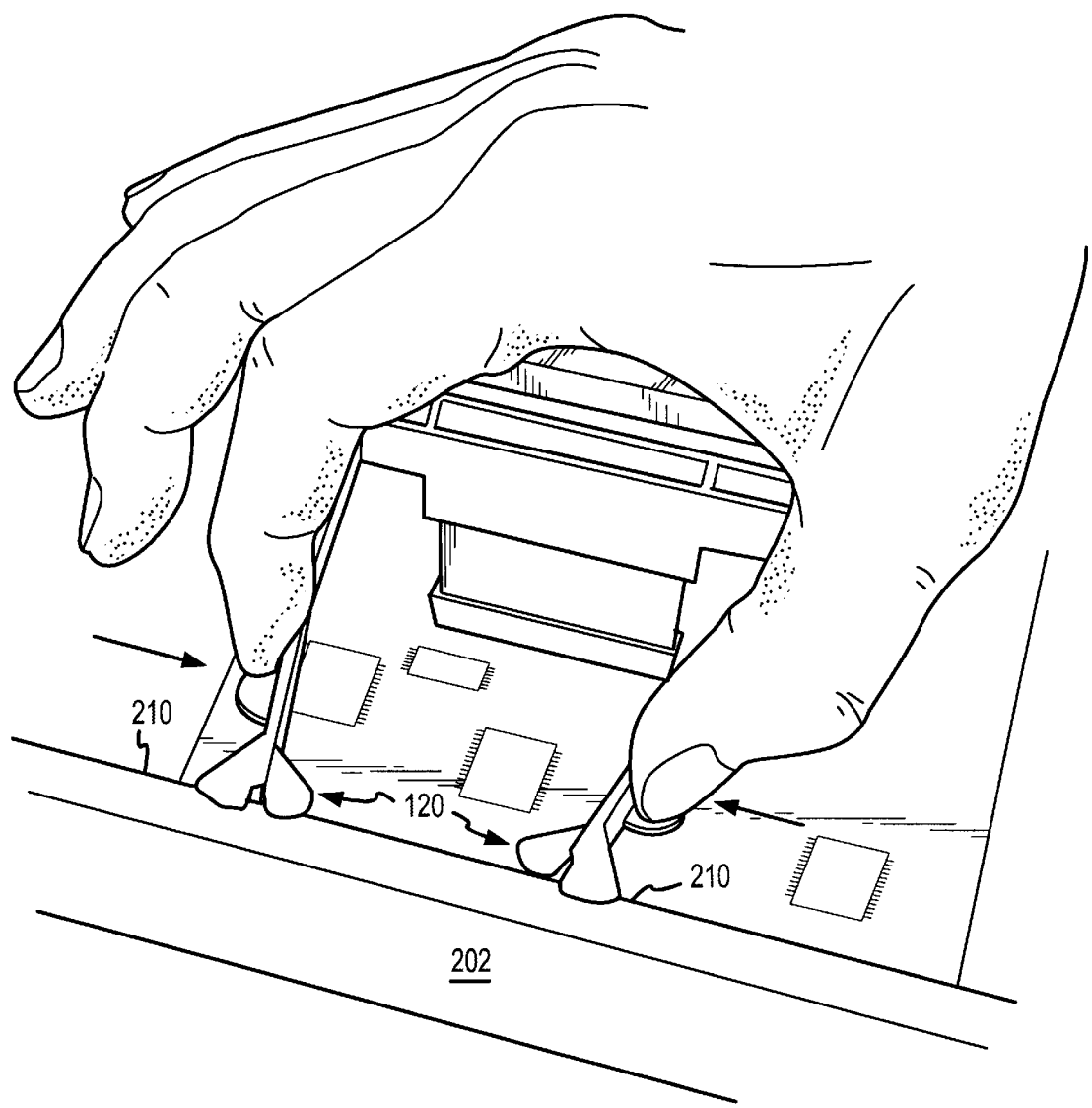
FIG. 3 illustrates disengaging the retention apparatus from a structural element of the data processing system.

Each arm includes, at its distal end (the end most distant from housing 102), a structure 120 that is configured to receive a structural element of the data processing system in which the electronic component resides. As depicted in FIG. 1, each structure 120 includes an upper tab 122 and a lower tab 124. The upper tab 1 22 and lower tab 124 are vertically displaced sufficiently to receive a suitable structural element of the data processing system between them. In one embodiment, the structural element that is received between upper and lower tabs 122 and 124 is a piece of sheet metal that is integrated with the data processing system housing or chassis. The structure 120 is preferably open ended so that structural element can be received without requiring any tools or specialized hardware. In an embodiment illustrated in greater detail in FIG. 3, the arms 110 and 114 are of sufficient flexibility to permit a user or technician to disengage structures 120 from a structural element 210 of a frame 202 by simply applying a compressive force to the arms such as by hand squeezing the arms together. In another embodiment, one of the two arms 110 and 114 is flexible and the other arm is substantially rigid. In this embodiment, apparatus 100 is disengaged by squeezing the flexible arm towards the rigid arm.

The depicted embodiment of apparatus 100 further includes at least one leg affixed to second surface 106 of housing 102 and extending substantially perpendicularly from second surface 102 and thereby extending from housing 102 in a direction opposite to the direction in which arms 110 and 114 extend. The depicted embodiment of apparatus 100 includes a first leg 130 affixed to second surface 106 of housing 102 proximal to first end 112 and a second leg 132 affixed to second surface 106 proximal to second end 116.

At a distal end of each leg, (the end distal from housing 102), each leg includes a second structure for receiving a structural element of the data processing system. In the depicted embodiment, the second structure 134 includes a toothed element 136 that is configured to hook under an edge of a structural element such as a piece of sheet metal. In the depicted embodiment a support element 138 located at the junction of each leg and second surface 106 of housing 102 prevents substantial movement of legs 132 and 130 with respect to housing 102.

Figure 2:
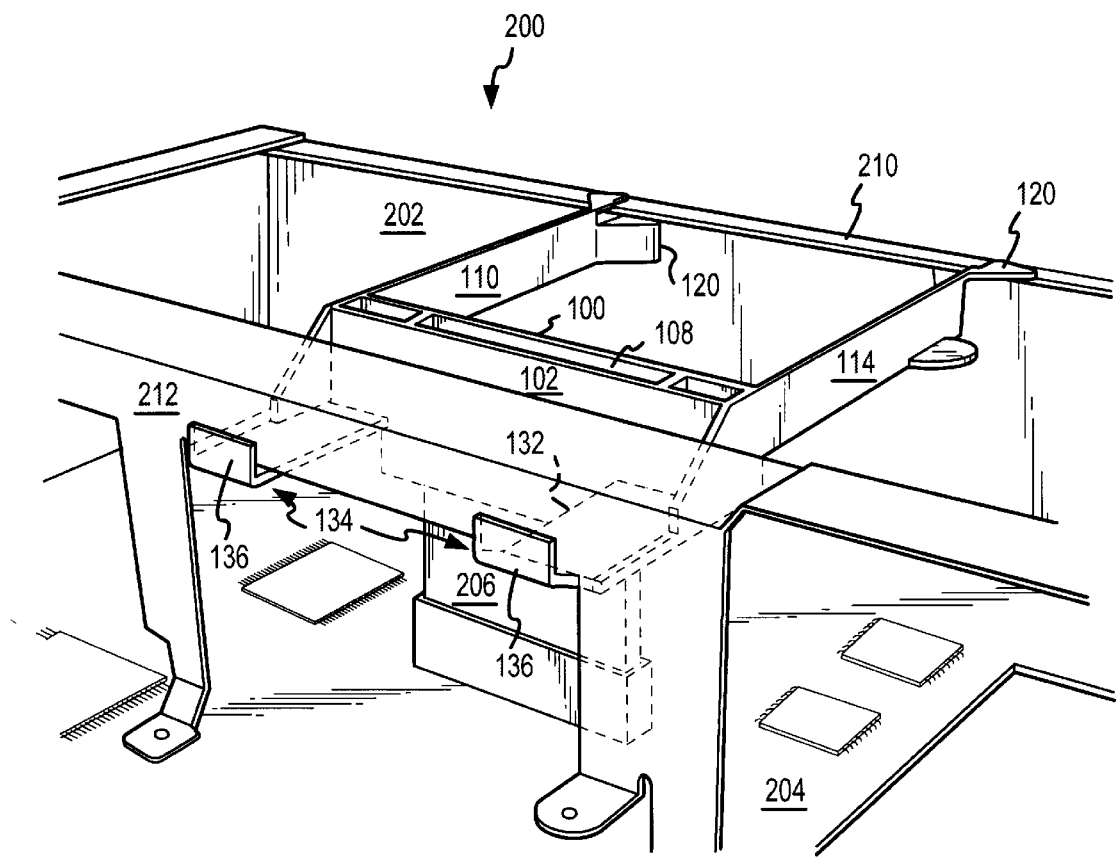
FIG. 2 illustrates a data processing system including a flash memory card and a flash memory card retention device according to the present invention.

Turning now to FIG. 2, a data processing system 200 according to one embodiment of the present invention is shown. In the depicted embodiment, data processing system 200 includes a frame 202 to which a motherboard 204 is affixed. An electronic component 206 is connected to the motherboard 204. In the depicted embodiment, the electronic component 206 is a flash memory card affixed to motherboard 204 with its plane perpendicular to the plane of motherboard 204. Frame 202 includes a first structural element 210. More specifically, structural element 210 as depicted in FIG. 2 comprises a portion of a formed piece of sheet metal. In the depicted embodiment, the portion of sheet metal that comprises the structural element 210 is substantially parallel to the plane of motherboard 204.

The retention apparatus 100 of data processing system 200 is shown installed with first structural element 210 engaged in receiving structures 120, a distal edge of electronic component 206 (the edge distal from motherboard 204) received in the aperture 108 of housing 102, and a second structural element 212 of frame 202 engaged by the toothed elements 136 of legs 130 and 132. The dimensions of apparatus 100 and housing 200 are sized such that first structural element 210 is displaced from electronic component 206 by a distance approximately equal to the length of arms 110 and 114 while second structural element 212 is displaced from electronic component 206 in the opposite direction by a distance approximately equal to the length of legs 130 and 132. Accordingly, when first structural element 210 and second structural element 212 are engaged by structures 120 and 134 respectively with electronic component 206 received in housing 108 of apparatus 102 at its distal edge and a socket connected to motherboard 204 at its proximal edge, apparatus 100 prevents substantial movement of electronic component 206 with respect to the frame 202 of the data processing system.

It will be apparent to those skilled in the art having the benefit of this disclosure that the present invention contemplates a cost effective device for maintaining a component such as a flash memory card positioned within its socket. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An apparatus suitable for retaining an electronic component of a data processing system within a socket attached to a circuit board of the data processing system, comprising:

a housing that defines an aperture suitably sized for receiving a distal end of the electronic component;

first and second arms extending from opposed surfaces of the housing, wherein a distal end of each arm includes a structure for receiving a structural element of the data processing system, wherein displacement of the electronic component relative to the structural element is restricted when the distal edge of the electronic component is received within the housing and the structural element is received within the receiving structures; and wherein the apparatus is configured such that squeezing the first and second arms towards each other frees the apparatus from the structural element.

2. The apparatus of claim 1, wherein the receiving structure includes an upper tab and a lower tab and the structural element comprises a sheet metal element of the data processing system, and wherein a vertical displacement between the upper and lower tabs is suitable for receiving the sheet metal element.

3. The apparatus of claim 2, wherein the aperture is suitable for receiving an electronic device that is compliant with the PC Card Standard.

4. The apparatus of claim 1, wherein the wherein the structural element comprises a portion of a chassis of the data processing system and wherein the receiving structures terminate within the chassis.

5. The apparatus of claim 1, further comprising at least one leg affixed to the housing and extending from the housing in a direction opposite the direction in which the arm extends from the housing, wherein a distal end of each of the at least one leg includes a second structure configured to receive a second structural element of the data processing system.

6. The apparatus of claim 5, wherein the second receiving structure comprises a toothed element suitable for hooking the lower edge of the second structural element.

7. The apparatus of claim 1, wherein the apparatus comprises molded plastic.

8. The apparatus of claim 1, wherein the electronic component is a flash memory card and the apparatus retains the flash memory card in a plane substantially perpendicular to a plane of the motherboard.

9. A data processing system comprising:

a chassis including a first structural element;

a motherboard affixed to an interior of the cabinet;

an electronic component, wherein a proximal edge of the electronic component is inserted in an electronic component connector affixed to the motherboard, wherein a plane of the electronic component is substantially perpendicular to a plane of the motherboard;

an electronic component retention apparatus, comprising:

a housing that defines an aperture suitably sized for receiving a distal end of the electronic component; and first and second arms extending from opposed surfaces of the housing, wherein a distal end of each of the arms includes a structure for receiving the first structural element, wherein the retention apparatus is configured such that squeezing the first and second arms towards each other frees the apparatus from the structural element.

10. The system of claim 9, wherein the receiving structure includes an upper tab and a lower tab and the structural element comprises a sheet metal element of the data processing system, and wherein a vertical displacement between the upper and lower tabs is suitable for receiving the sheet metal element.

11. The system of claim 9, wherein the structural element comprises a portion of the chassis and wherein the receiving structures terminate within the chassis.

12. The system of claim 9, further comprising at least one leg affixed to the housing and extending from the housing in a direction opposite the direction in which the arm extends from the housing, wherein a distal end of each of the at least one legs includes a second structure configured to receive a second structural element of the data processing system.

13. The system of claim 12, wherein the second receiving structure comprises a toothed element suitable for hooking a lower edge of the second structural element.

14. The system of claim 9, wherein the apparatus comprises molded plastic.

15. The system of claim 9, wherein the electronic component is a flash memory card and the apparatus retains the flash memory card in a plane substantially perpendicular to a plane of the motherboard.

* * * * *